United States Patent [19]

Kazmierowicz

[11] 4,070,517
[45] Jan. 24, 1978

[54] LOW FIRED CONDUCTIVE COMPOSITIONS

[75] Inventor: Casimir W. Kazmierowicz, Mission Viejo, Calif.

[73] Assignee: Beckman Instruments, Inc., Fullerton, Calif.

[21] Appl. No.: 703,393

[22] Filed: July 8, 1976

[51] Int. Cl.² .............................................. H01B 1/02
[52] U.S. Cl. .................................. 428/209; 428/215; 428/901; 252/512; 252/513; 252/518; 106/1.12; 106/1.05
[58] Field of Search ....................... 252/513, 512, 518; 106/1; 428/427, 433, 209, 215, 901; 338/308

[56] References Cited

U.S. PATENT DOCUMENTS

| | | | |
|---|---|---|---|
| 3,484,284 | 12/1969 | Dates et al. | 252/513 |
| 3,794,518 | 2/1974 | Howell | 252/513 X |
| 3,854,957 | 12/1974 | Larry | 106/1 |
| 3,904,461 | 9/1975 | Estep et al. | 338/308 X |
| 3,929,674 | 12/1975 | Patterson | 252/518 X |
| 3,943,168 | 3/1976 | Patterson | 252/518 X |
| 3,948,812 | 4/1976 | Corren et al. | 252/512 |

*Primary Examiner*—Benjamin R. Padgett
*Assistant Examiner*—E. Suzanne Parr
*Attorney, Agent, or Firm*—Robert J. Steinmeyer; Ferd L. Mehlhoff; Robert S. Frieman

[57] ABSTRACT

Disclosed herein are powder compositions useful for making conductors, e.g., microcircuit conductors, end terminations for capacitors, electrodes for gas discharge display devices, etc. The compositions comprise inorganic powders dispersed in an inert vehicle and are printed and fired in the conventional manner on dielectric substrates. The inorganic powders comprise a mixture of nickel and/or aluminum or copper and boron. Glass powder and/or silicon powder may also be present.

11 Claims, No Drawings

LOW FIRED CONDUCTIVE COMPOSITIONS

BACKGROUND OF THE INVENTION

1. Field of the Invention

This invention relates to electronics, and more particularly to compositions useful for producing conductor patterns adherent to substrates.

2. Description of the Prior Art

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the printed film, the metallic component of the composition provides the functional (conductive) utility, while the inorganic binder (e.g., glass, $Bi_2O_3$, etc.) bonds the metal particles to one another and to the substrate. Thick film techniques are contrasted with thin film techniques which involve deposition of particles by evaporation or sputtering. Thick film techniques are generally discussed in "Handbook of Materials and Processes for Electronics," C. A. Harper, Editor, McGraw-Hill, N.Y., 1970, Chapter 12.

The most commonly used conductor compositions employ noble metals, especially gold, silver, platinum, palladium, and their mixtures, alloys, and compounds, since their relatively inert characteristics permit firing in air. Attempts at using dispersions of less expensive non-noble metals have often been confined to specialized uses or have required the great practical inconvenience and expense of firing in non-oxidizing atmospheres (nitrogen/hydrogen, hydrogen, argon, etc.).

There is a distinct commercial need for less expensive conductor compositions which can be fired in air to produce adherent low resistivity conductors on dielectric substrates, including microcircuit patterns, end terminations for resistors, etc.

Present commercial practice in the manufacture of gas discharge display devices is to fire nickel powders in a reducing or inert (non-oxidizing) atmosphere at high temperatures (e.g., above 900° C.) on relatively expensive forsterite ($2MgO.SiO_2$), steatite, alumina, and beryllia substrates. Nickel is used due to its low tendency to sputter under glow discharge. The use of inexpensive, mass-produced, high quality glass substrates such as soda lime glass substrates would be desirable. However, the use of soda lime glass substrates limits the firing temperature of conductors thereon to no more than about 700° C., due to the low softening point of the glass. At these low temperatures it is very difficult to obtain good metallic sintering of nickel; consequently, adherent low resistivity nickel conductors are difficult to make.

There is consequently the need for a nickel-based conductor which can be fired below 700° C. in making gas discharge display devices on soda lime glass substrates. It is further desirable that the compositions be fireable in air, rather than in more expensive atmospheres (inert or reducing atmospheres).

Huang et al. U.S. Pat. No. 3,503,801, issued Mar. 31, 1970, discloses the use of metal borides and glass in the manufacture of resistors. The borides include those of chromium, zirconium, molybdenum, tantalum, and titanium. No nickel borides are suggested. Numerous patents disclose the deposition of coatings of nickel and boron (not nickel boride) on substrates from a plating bath of materials such as amine boranes (see U.S. Pat. No. 3,045,334, issued July 24, 1972, and U.S. Pat. No. 3,338,726, issued Aug. 29, 1967, each to Berzins), and three patents to Bellis, U.S. Pat. No. 3,672,964, issued June 27, 1972, U.S. Pat. No. 3,674,447, issued July 4, 1972, and U.S. Pat. No. 3,738,849, issued June 12, 1973. These patents relate to plating Ni/B coatings on the entire surface exposed to such a bath.

Metal borides and silicides have been reported to be inert to oxidation at room temperature. At elevated temperature, borides are oxidized, although rates of oxidation vary, Greenwood et al., Quarterly Reviews (London) 20, page 441, 1966. German Patent Publication OS 2,222,695, published Nov. 22, 1973, discloses base metal resistor compositions of boron, molybdenum, or tungsten silicides plus molybdenum or tungsten glasses. Howell U.S. Pat. No. 3,794,518, issued Feb. 26, 1974, discloses resistors also, of glass plus certain copper nickel alloys, which were fired in an inert atmosphere (column 3, line 74) to resistors which fuse (open) when subjected to overload.

Representative of art on gas discharge display devices are the following patents, each of which is hereby incorporated in toto by reference herein. McCauley U.S. Pat. No. 2,991,387 (issued July 4, 1961) discloses tube-type display devices. Bentley U.S. Pat. No. 2,933,648 (issued Apr. 19, 1960) discloses flat display devices employing a multiplicity of display cavities. Ogle U.S. Pat. No. 3,558,975 (issued Jan. 26, 1971) discloses glass display devices using electrodes of gold or the like. Milgram U.S. Pat. No. 3,788,722 (issued Jan. 29, 1974) discloses process for manufacturing flat display devices from ceramic tape and precious metal pastes; FIG. 4 is a top view of a line bar gas display device. Recent non-tube display devices include the Burroughs Panaplex II panel display, described in Burroughs Bulletin No. 1179A dated Mar. 1974; these are a family of common envelope, multidigit display devices. Nickel-based electrodes fireable in air would be especially useful for the displays of types represented by the above patents and bulletin.

SUMMARY OF THE INVENTION

This invention provides nickel-boron, aluminum-boron, copper-boron, and aluminum-nickel-boron compositions used for producing conductor patterns on dielectric substrates. The compositions can, but need not be, fired in air. Moreover, they can be fired even at temperatures compatible with the use of inexpensive soda lime glass substrates. The compositions nonetheless can produce conductor patterns having useful resistivities and adhesion.

The compositions of this invention are finely divided inorganic powders dispersed in a liquid vehicle. The inorganic nickel-boron powder compositions comprise a mixture of from about 90 to about 99 weight percent elemental nickel and from about 1 to about 10 weight percent elemental boron. When silicon is also present in the inorganic powder, the mixture comprises from about 98 to about 99.5 weight percent nickel and from about 0.5 to about 2 weight percent of a powder, wherein the powder comprises from about 50 to about 100 weight percent boron and from about 0 to about 50 weight percent silicon.

The nickel-boron compositions of the present invention, in addition to such inorganic powders, normally comprise conventional inorganic binder, such as glass, lead oxide (PbO), etc., well known to those skilled in the art. On an inorganic solids basis, glass containing compositions comprise from about 64 to about 96.5 weight percent nickel, from about 1.5 to about 6 weight percent boron, and from about 2 to about 30 weight percent glass. When the composition contains nickel, boron, silicon, glass, and lead oxide, the composition can comprise from about 50 to about 99 weight percent nickel, from about 0.5 to about 12 weight percent boron, from about 0 to about 12 weight percent silicon, from about 0 to about 30 weight percent glass, and from about 0 to about 15 weight percent lead oxide, wherein the combined percentages of boron and silicon is from about 0.5 to about 15 weight percent of the composition.

Where unencapsulated conductors are to be exposed to high humidity for long periods, preferred nickel-boron compositions of the invention comprise mixtures of nickel, boron, and silicon.

The inorganic copper-boron powder compositions comprise a mixture of from about 66 to about 88 weight percent copper, from about 4 to about 15 weight percent boron, and from about 5 to about 30 weight percent glass frit.

The inorganic aluminum-boron compositions within the scope of the present invention comprise from about 0 to about 10 weight percent boron, from about 50 to about 90 weight percent aluminum, and from about 1 to about 50 weight percent glass. When silicon is also present in the inorganic powder, the mixture comprises from about 0.2 to about 8 weight percent silicon, from about 0.2 to about 8 weight percent boron, from about 49 to about 94 weight percent aluminum, and from about 5 to about 50 weight percent glass.

The aluminum-nickel-boron compositions of the present invention comprise from about 5 to about 20 weight percent nickel, from about 0.2 to about 4 weight percent silicon, from about 0.2 to about 4 weight percent boron, from about 50 to about 85 weight percent aluminum, and from about 9 to about 40 weight percent glass.

Also within the scope of the instant invention is a composition comprising from about 98 to about 99.5 weight percent nickel oxide and from about 0.5 to about 2 weight percent boron.

The present invention also is the composition of the present invention fired (sintered) on and adherent to a dielectric substrate, such as glass, glass-ceramic, and ceramic substrates. The present invention also involves improved gas discharge display devices. Such devices comprise two dielectric substrates having conductor patterns printed on one or both thereof in operative fashion. The substrates are assembled such that a dielectric spacer separates them and defines a cavity or gap between the substrates. The device is, of course, provided with means for holding the two substrates and separator together, e.g., clamps, adhesive, etc. The cavity is filled with an ionizable light-producing gas of the type well known to those skilled in the art (including argon, neon, or the like, separately or in mixtures). In the use of such devices an electric current is applied as desired to various electrode segments, causing ionization and production of light. The improvement in the devices of the present invention lies in the use of electrodes of the sintered or fired compositions of the present invention, that is, the electrodes are produced by printing on the substrate a dispersion of one or more of the nickel-boron, aluminum-boron, copper-boron, and aluminum-nickel-boron containing compositions of the present invention.

As indicated above, various other inorganic powders are optional in those compositions. A preferred substrate is glass, especially soda lime glass.

DETAILED DESCRIPTION OF THE INVENTION

The compositions of the present invention are finely divided powders dispersed in a liquid vehicle. The inorganic nickel-boron powder compositions comprise a mixture of from about 90 to about 99, preferably 95 to 99, and more preferably 97 to 99, weight percent nickel and from about 1 to about 10, preferably from about 1 to about 5, and more preferably from about 1 to about 3, weight percent boron.

The nickel-boron-glass compositions of the present invention comprise from about 2 to about 30, preferably from about 5 to about 20, and more preferably about 15, weight percent glass; from about 64 to about 96.5, preferably from about 75 to about 93, and more preferably about 82, weight percent nickel; and from about 1.5 to about 6, preferably from about 2 to about 5, and more preferably about 3 weight percent boron.

The nickel-boron-silicon compositions of the present invention comprise from about 98 to about 99.5 weight percent nickel and from about 0.5 to about 2 percent of a material comprising from about 50 to about 100 weight percent boron and from about 0 to about 50 weight percent silicon.

Another composition within the scope of the present invention can comprise from about 50 to about 99, preferably from about 58 to about 92, and more preferably about 79, weight percent nickel; from about 0 to about 30, preferably from about 5 to about 20, and more preferably about 11, weight percent glass; from about 0 to about 15, preferably from about 0 to about 10, more preferably about 4, weight percent lead oxide; from about 0.5 to about 12, preferably from about 2 to about 6, and more preferably about 3, weight percent boron; and from about 0 to about 12, preferably from about 0 to about 6, and more preferably about 3, weight percent silicon. The combined weight percentages of boron and silicon in this composition is from about 0.5 to about 15, preferably from about 2 to about 8, and more preferably 6, weight percent.

Also within the scope of the present invention is a composition comprising from about 98 to about 99.5 weight percent nickel oxide and from about 0.5 to about 2 weight percent boron.

The copper-boron composition within the scope of the present invention comprises from about 66 to about 88, preferably from about 71 to about 76, and more preferably about 73, weight percent copper; from about 4 to about 15, preferably from about 8 to about 11, and more preferably about 10, weight percent boron; and from about 5 to about 30, preferably from about 15 to about 21, and more preferably about 17, weight percent glass frit. A minimum of 4 weight percent boron is required in the above copper-boron composition. Boron in excess of this minimum amount can optionally be replaced by silicon.

A copper-nickel-boron composition within the scope of this invention comprises from about 65 to about 80 weight percent of constantan, i.e., an alloy comprising from about 40 to about 45 weight percent nickel and from about 55 to about 60 weight percent copper, from about 10 to about 20 weight percent glass frit, and from about 10 to about 15 weight percent boron.

An aluminum composition of the present invention comprises from about 75 to about 90, preferably 80, weight percent aluminum and from about 10 to about 25, preferably about 20, weight percent glass binder.

The aluminum-boron composition within the scope of the instant invention comprises from about 0 to about 10, preferably from about 0.5 to about 1, more preferably about 1, weight percent boron; from about 50 to about 90, preferably from about 70 to about 80, more preferably about 74, weight percent aluminum; and from about 1 to about 50, preferably from about 19 to about 29, and more preferably about 25, weight percent glass.

When silicon is present in the aluminum-boron composition, the composition can comprise from about 0.2 to about 6, preferably about 0.5, weight percent silicon; from about 0.2 to about 2, preferably about 0.5, weight percent boron; from about 75 to about 90, preferably about 80, weight percent aluminum; and from about 2 to about 24, preferably about 19 weight percent glass.

The aluminum-nickel-boron composition of this invention comprises from about 5 to about 20, preferably about 10, weight percent nickel; from about 0.2 to about 4, preferably about 1.5, weight percent silicon; from about 0.2 to about 4, preferably about 0.5, weight percent boron; from about 50 to about 85, preferably about 63, weight percent aluminum; and from about 9 to about 40, preferably about 25, weight percent glass. When the aluminum-nickel-boron composition also contains lead oxide, the composition comprises from about 50 to about 85, preferably about 65, weight percent aluminum; from about 9 to about 40, preferably about 26, weight percent glass; from about 5 to about 20, preferably about 8, weight percent nickel, from about 0 to about 2, preferably about 0.4, weight percent lead oxide; from about 0.2 to about 4, preferably about 0.3, weight percent silicon; and from about 0.2 to about 4, preferably about 0.3, weight percent boron.

The essential components of the compositions of the present invention are the metals (nickel, aluminum, and copper) and elemental boron. During firing of the mixtures, most of the metal remains unoxidized, encapsulated by $B_2O_3$; where silicon is also present the metal will be encapsulated by $B_2O_3/SiO_2$. Such systems initially fired in air can, therefore, be refired in air without substantial oxidation and consequent degradation of electrical properties (e.g., increased resistivity). This ability to withstand refiring is quite useful in the assembly of a gas discharge display device since multiple firing steps may be involved (e.g., metal conductor, dielectric insulating layer, metal cathode, and contrasting dielectric).

The compositions of the present invention will normally be fired at temperatures in the range from about 550° to about 700° C, preferably from about 580° to about 650° C.; although air firing is most convenient, they can also be fired in inert or reducing atmospheres. Normally the time of firing is at least 2 minutes, preferably about 10 minutes, at peak temperature.

Where gas discharge display devices are made on soda lime glass substrates, firing temperatures in the 550° to 650° C. range will be used, preferably from about 580° to about 625° C.

The nickel-boron compositions of the present invention can be made by either simply mixing the desired amounts of elemental nickel and elemental boron together or by mixing and calcining the mixture. Calcining preferably entails heating the mixture to about 700° C. for about one hour in an inert atmosphere such as nitrogen or argon. When the composition comprises nickel, boron, and silicon, the composition can also be made by either simply mixing the desired amounts of elemental nickel, elemental boron, and elemental silicon together or by mixing and calcining the mixture as discussed above.

The nickel oxide-boron compositions within the scope of the instant invention can be made by mixing the desired amounts of nickel oxide and boron along with an appropriate organic binder to make a thick film ink which provides dense conductors when fired in a hydrogen atmosphere. These conductors can then be refired in air with very little oxidation of the nickel.

The copper-boron, aluminum-boron, and aluminum-nickel-boron compositions can be made by simply mixing the desired amounts of the appropriate components together.

Any conventional electronic glass powder can be used as the inorganic binder in the compositions of the present invention, as known to those skilled in the art, including, for example, those of Larson and Short U.S. Pat. No. 2,822,279 (issued Feb. 4, 1958); Short U.S. Pat. No. 2,819,170 (issued Jan. 7, 1958); etc. A phase diagram depicting the preferred glass frits used in the present invention appears in R. F. Geller and E. R. Bunting, J. Res. Natl. Bur. of Standards, 23 (8): 279 (1939); RP 123, said phase diagram being incorporated herein in toto by reference.

All the inorganic powders used herein are finely divided, i.e., pass through a 400 mesh screen. It is preferred that the particles have an average particle size of 10 microns or less.

The inorganic particles are mixed with an inert liquid vehicle by mechanical mixing (e.g., on a roll mill) to form a paste-like composition. The latter is printed as "thick film" on conventional dielectric substrates in the conventional manner. Any inert liquid may be used as the vehicle. Water or any one of various organic liquids, with or without thickening and/or stabilizing agents and/or other common additives, can be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of vehicle to solids in the dispersions can vary considerably and depends upon the manner in which the dispersion is to be applied and the kind of vehicle used. Normally to achieve good coverage the dispersions will contain from about 65 to about 85 weight percent solids and from about 15 to about 35 weight percent vehicle. The compositions of the present invention can, of course, be modified by the addition of other materials which do not affect its beneficial characteristics.

After drying to remove the vehicle, firing of the compositions of the present invention is carried out at temperatures and for times sufficient to sinter the inorganic materials and to produce conductor patterns adherent to the dielectric substrate, as discussed above.

Also within the scope of the instant invention is a dielectric substrate, preferably a glass substrate, having fired thereon one of the aluminum compositions of the present invention, preferably an aluminum-nickel-boron composition containing aluminum, nickel, boron, glass, silicon and more preferably also containing lead oxide. This conductive cermet has electroless plated thereon a nickel strike of from about 0.05 to about 0.5, preferably about 0.1, mil thick. This nickel strike, electroless plated cermet conductor is especially desirable for use as a cathode discharge surface. The particular electroless nickel plating process used is not critical and any of the various electroless nickel plating processes known to those skilled in the art can be used.

The advance involved in the gas discharge display devices of the present invention is in the use of the various compositions of the present invention as some or all of the electrodes. The geometry of the display device is not of the essence of the present invention. Any appropriate geometry can be used in manufacturing the display device. The display device will comprise dielectric substrates having a cavity therebetween. The cavity is provided by a spacer between the substrates. The substrates and spacer are clamped or adhesively connected together. The substrates have electrodes of the present invention fired (sintered) thereon, the compositions of the present invention having been deposited (e.g. printed) thereon in the desired pattern, followed by heating to produce physically and electrically continuous conductors. The device can include printed dielectric layers, as well known in the art. The device will include means for evacuating the cavity and then filling with the appropriate excitable gas. The electrodes are, of course, operatively connected electrically with the desired electrical circuits.

The following examples are provided for the purpose of further illustrations only and are not intended to be limitations on the disclosed invention.

EXAMPLE 1

Nickel-Boron conductors

Nickel (97 weight percent) and 3 weight percent boron were thoroughly intermixed in methanol with a ball mill. The mixture was calcined together by heating the mixture to about 700° C. for about one hour in an inert nitrogen atmosphere. This heating yielded a medium-hard calcine. The calcined product was then crushed with a ball mill to a relatively uniform fine powder. This powder was then mixed with an organic paste vehicle and screen-applied on a glass substrate and fired in air at about 600° C. (oven peak temperature). The resistivity of the resulting cermet conductor is shown in Table I.

Several other nickel-boron cermets (Examples 2 and 3) were prepared in a manner analogous to that described in Example 1. The resistivity of the cermets so prepared are also listed in Table I.

TABLE I

| Example No. | Ni (wt.%) | Boron (wt.%) | Resistivity (ohm/square) |
|---|---|---|---|
| 1 | 97 | 3 | 0.2 |
| 2 | 99 | 1 | 4.0 |
| 3 | 95 | 5 | 0.1 |

EXAMPLE 4

Nickel-Boron-Glass conductors

To a calcined nickel-boron mixture was added 5 weight percent of a glass comprising 83% lead oxide, 10% $B_2O_3$, and 7% $SiO_2$. This mixture was also mixed with an organic vehicle and applied to a glass substrate and fired in air at about 600° C. The resistivity obtained from this cermet conductor is listed in Table II.

Other nickel-boron-glass conductors (Examples 5 to 16) made in a manner analogous to the method above described are also listed in Table II.

TABLE II

| Example No. | Ni (wt.%) | Boron (wt.%) | Glass (wt.%) | Resistivity (ohm/square) |
|---|---|---|---|---|
| 4 | 92 | 3 | 5 | 0.068 |
| 5 | 93 | 2 | 5 | 0.13 |
| 6 | 91 | 4 | 5 | 0.068 |
| 7 | 88 | 2 | 10 | 0.055 |
| 8 | 87 | 3 | 10 | 0.07 |
| 9 | 86 | 4 | 10 | 0.06 |
| 10 | 83 | 2 | 15 | 0.9 |
| 11 | 82 | 3 | 15 | 0.17 |
| 12 | 81 | 4 | 15 | 0.06 |
| 13 | 80 | 5 | 15 | 0.04 |
| 14 | 78 | 2 | 20 | 1.8 |
| 15 | 77 | 3 | 20 | 0.2 |
| 16 | 76 | 4 | 20 | 0.15 |

EXAMPLE 17

Nickel-Boron-Silicon-Lead Glass-Lead Oxide conductors

Glass (comprising 83 weight percent PbO, 10 weight percent $B_2O_3$, and 7 weight percent $SiO_2$; size minus 325 mesh) and nickel oxide were combined to form a 10 weight percent glass - 90 weight percent nickel oxide mixture. This mixture was ground in a milling vessel together with methanol for about 5 hours. The mix was then oven dried and hydrogen-calcined at 700° C. for one hour. It was then screened through a 60 mesh screen and intermixed with lead oxide, boron, and silicon, as follows: 90 percent calcined nickel oxide-glass mixture, 4 weight percent lead oxide, 3 weight percent silicon capable of passing through a −325 mesh, and 3 percent boron. This mixture was ground in a milling jar in a methanol vehicle for about 16 hours and then oven dried and screened through a 400 mesh screen. The above cermet powder was then made into a paste comprising 75 percent of said powder and 25 percent of a carboxy-methyl-cellulose organic vehicle. This paste was intermixed to thoroughly wet all of the powder, and then the mixing was carried out for about one hour in a mechanical mortar and pestle. The resulting paste composition was applied to a glass substrate by normal screen printing techniques and then fired in a conveyor furnace at between 600° to 700° C. in air for about 10 minutes. The sheet-resistivity of the fired material is listed in Table III.

Other nickel-boron-silicon-lead glass-lead oxide conductors (Examples 18 to 30) prepared in the above manner are also listed in Table III.

TABLE III

| Example No. | Nickel (wt.%) | Boron (wt.%) | Silicon (wt.%) | Glass (wt.%) | Lead Oxide (wt.%) | Resistivity (ohm/square) |
|---|---|---|---|---|---|---|
| 17 | 81 | 3   | 3    | 9 | 4    | 0.027 |
| 18 | 81 | 3.5 | 5.25 | 9 | 1.25 | 0.024 |
| 19 | 81 | 3.5 | 4.25 | 9 | 2.25 | 0.032 |
| 20 | 81 | 3.5 | 3.25 | 9 | 3.25 | 0.032 |
| 21 | 81 | 3.5 | 2.25 | 9 | 4.25 | 0.027 |
| 22 | 81 | 3.5 | 1.25 | 9 | 5.25 | 0.017 |
| 23 | 81 | 3   | 6    | 9 | 1    | 0.027 |
| 24 | 81 | 3   | 5    | 9 | 2    | 0.036 |
| 25 | 81 | 3   | 4    | 9 | 3    | 0.032 |
| 26 | 81 | 3   | 2    | 9 | 5    | 0.027 |
| 27 | 81 | 3   | 1    | 9 | 6    | 0.032 |
| 28 | 81 | 2.5 | 5.75 | 9 | 1.75 | 0.095 |
| 29 | 81 | 2.5 | 4.75 | 9 | 2.75 | 0.170 |
| 30 | 81 | 2.5 | 3.75 | 9 | 3.75 | 0.614 |

EXAMPLE 31

Copper-Boron-Glass conductors

Glass (comprising 83 weight percent PbO, 10 weight percent $B_2O_3$, and 7 weight percent $SiO_2$; size minus 325 mesh), copper, and boron were intermixed as follows: 25.6 weight percent glass, 68 weight percent copper, and 6.4 weight percent boron. This mixture was ground in a milling jar in a methanol vehicle for about 16 hours and then oven dried and screened through a 400 mesh screen. The above cermet powder was then made into a paste comprising 75 percent of said powder and 25 percent of a carboxy-methyl-cellulose organic vehicle. This paste was intermixed to thoroughly wet all of the powder, and then the mixing was carried out for about one hour in a mechanical mortar and pestle. The resulting paste composition was applied to a glass substrate and an alumina substrate by normal screen printing techniques and then fired in a conveyor furnace at about 700° C. in air for about 10 minutes. The sheet-resistivity of the fired materials is listed in Table IV.

Other copper-boron-glass conductors (Examples 32 to 50) prepared in the above manner are also listed in Table IV.

It should be noted that because copper is more readily oxidized than nickel, the minimum amount of boron necessary in the copper-boron compositions to produce a desirable conductor is greater than the minimum amount of boron necessary in nickel-boron compositions.

TABLE IV

| Ex. No. | Boron wt.% | Glass wt.% | Copper Powder wt.% | Resistivity ohm/square fired at 700° C in Air on Alumina | Resistivity ohm/square fired at 700° C in Air on Glass |
|---|---|---|---|---|---|
| 31 | 6.4  | 25.6 | 68   | 0.02  | ∞ |
| 32 | 6.4  | 23.2 | 70.4 | 0.01  | ∞ |
| 33 | 6.4  | 20.8 | 72.8 | 0.04  | ∞ |
| 34 | 6.4  | 18.4 | 75.2 | 20K   | 100K |
| 35 | 6.4  | 16.0 | 77.6 | 100K  | 0.03 |
| 36 | 8.8  | 23.2 | 68   | 0.009 | 0.009 |
| 37 | 8.8  | 20.8 | 70.4 | 0.01  | 0.009 |
| 38 | 8.8  | 18.4 | 72.8 | 0.01  | 0.009 |
| 39 | 8.8  | 16.0 | 75.2 | 0.009 | 0.007 |
| 40 | 8.8  | 13.6 | 77.6 | 20K   | 0.01 |
| 41 | 11.2 | 20.8 | 68   | 0.015 | 0.015 |
| 42 | 11.2 | 18.4 | 70.4 | 0.015 | 0.015 |
| 43 | 11.2 | 16.0 | 72.8 | 0.015 | 0.015 |
| 44 | 11.2 | 13.6 | 75.2 | 15K   | 0.012 |
| 45 | 11.2 | 8.8  | 80.0 | 100K  | 0.015 |
| 46 | 13.6 | 18.4 | 68   | 0.02  | 0.015 |
| 47 | 13.6 | 16.0 | 70.4 | 0.02  | 0.015 |
| 48 | 13.6 | 13.6 | 72.8 | 56    | 0.02 |
| 49 | 16.0 | 16.0 | 68   | 0.02  | 0.02 |
| 50 | 16.0 | 8.8  | 75.2 | 120K  | 0.02 |

EXAMPLE 51

Aluminum-Boron-Glass conductors

Glass (comprising 83 weight percent PbO, 10 weight percent $B_2O_3$, and 7 weight percent $SiO_2$; size minus 325 mesh), aluminum, and boron were intermixed as follows: 0.5 weight percent boron, 25 weight percent glass, and 74.5 weight percent aluminum. This mixture was dry mixed in a glass jar for about 16 hours. The above cermet powder was then made into a paste comprising 75 percent of said powder and 25 percent of a carboxymethyl-cellulose organic vehicle. This paste was intermixed to thoroughly wet all of the powder, and then the mixing was carried out for about one hour in a mechanical mortar and pestle. The resulting paste composition was applied to a glass substrate by normal screen printing techniques and then fired in a conveyor furnace at about 650° C. in air for about 10 minutes. The sheet-resistivity of the fired material is listed in Table V.

Other aluminum-boron-glass conductors (Examples 52 to 59) prepared in the above manner are also listed in Table V.

TABLE V

| Example No. | Boron wt.% | Glass wt.% | Aluminum Powder wt.% | Fired in Air at 650° C Resistivity ohm/square |
|---|---|---|---|---|
| 51 | 0.5 | 25 | 74.5 | 0.02 |
| 52 | 1.0 | 25 | 74.0 | 0.02 |
| 53 | 1.0 | 50 | 49.0 | 0.1 |
| 54 | 3.0 | 10 | 87.0 | 0.02 |
| 55 | 4.0 | 10 | 86.0 | 0.025 |
| 56 | 0   | 20 | 80.0 | 0.2 |
| 57 | 3   | 20 | 77.0 | 0.03 |
| 58 | 5   | 20 | 75.0 | 0.04 |
| 59 | 2   | 15 | 83.0 | 0.02 |

EXAMPLE 60

Aluminum-boron-silicon-glass conductors

A composition comprising 19 weight percent glass, 80 weight percent aluminum, 0.5 weight percent boron, and 0.5 weight percent silicon was prepared in a manner analogous to that set forth in Example 51. After screening the paste onto several glass substrates, one glass substrate was fired at about 600° C. in air and another was fired at about 670° C. in air. The fired materials had a sheet resistivity of 0.04 and 0.01 ohms/square, respectively.

EXAMPLE 61

Aluminum-boron-silicon-nickel-glass conductors

A composition comprising about 10 weight percent nickel powder, 1.5 weight percent silicon, 0.5 weight percent boron, 63 weight percent aluminum, and 25 weight percent glass was prepared in a manner analogous to that set forth in Example 51. After screening the paste onto several glass substrates, the materials were fired at from about 600° to about 675° C. in air. The fired materials exhibited a sheet resistivity of from about 0.03 to about 0.05 ohms/square.

EXAMPLE 62

Aluminum-boron-silicon-nickel-lead oxide-glass conductors

A composition comprising about 65 weight percent aluminum having an average particle diameter of about 4 to 5 microns, 26 weight percent glass, 8 weight percent nickel, 0.4 weight percent lead oxide, 0.3 weight percent silicon, and 0.03 weight percent boron was prepared in a manner analogous to that set forth in Example 51. After screening the paste onto several glass substrates, each material was fired at a particular temperature (i.e., 615° C., 625° C., 635° C., and 645° C.) in air. The sheet-resistivity of the fired materials is listed in Table VI.

Other aluminum-boron-silicon-nickel-lead oxide-glass conductors (Examples 63 and 64) prepared in the above manner are also listed in Table VI.

TABLE VI

| Ex. No. | Average Particle Diameter of Al, Microns | Resistivity ohm/square Fired at | | | |
|---|---|---|---|---|---|
| | | 615° C | 625° C | 635° C | 645° C |
| 62 | 4–5 | 0.20 | 0.08 | 0.03 | 0.04 |
| 63 | 9–10 | 0.16 | 0.05 | 0.05 | 0.06 |
| 64 | 13–14 | 200 | 0.8 | 0.07 | 0.06 |

Based on this disclosure, many other modifications and ramifications will naturally suggest themselves to those skilled in the art. These are intended to be comprehended as within the scope of this invention.

The embodiments of the invention in which an exclusive property or privilege is claimed are defined as follows:

1. A composition comprising about 79 weight percent nickel, about 11 weight percent glass, about 4 weight percent lead oxide, about 3 weight percent boron, and about 3 weight percent silicon.

2. A composition comprising from about 0.2 to about 6 weight percent silicon, from about 0.2 to about 2 weight percent boron, from about 75 to about 90 weight percent aluminum, and from about 2 to about 24 weight percent glass.

3. The composition of claim 2 comprising about 0.5 weight percent silicon, about 0.5 weight percent boron, about 80 weight percent aluminum, and about 19 weight percent glass.

4. A composition comprising from about 5 to about 20 weight percent nickel, from about 0.2 to about 4 weight percent silicon, from about 0.2 to about 4 weight percent boron, from about 50 to about 85 weight percent aluminum, and from about 9 to about 40 weight percent glass.

5. The composition of claim 4 comprising about 10 weight percent nickel, about 1.5 weight percent silicon, about 0.5 weight percent boron, about 63 percent aluminum, and about 25 weight percent glass.

6. The composition of claim 4 comprising from about 50 to about 85 weight percent aluminum, from about 9 to about 40 weight percent glass, from about 5 to about 20 weight percent nickel, from about 0 to about 2 weight percent lead oxide, from about 0.2 to about 4 weight percent silicon, and from about 0.2 to about 4 weight percent boron.

7. The composition of claim 6 comprising about 65 weight percent aluminum, about 26 weight percent glass, about 8 weight percent nickel, about 0.4 weight percent lead oxide, about 0.3 weight percent silicon, and about 0.3 weight percent boron.

8. A composition comprising from about 98 to about 99.5 weight percent nickel oxide and from about 0.5 to about 2 weight percent boron.

9. A conductor comprising successively a nonconducting substrate; a thick film pattern comprising from about 0.2 to about 6 weight percent silicon, from about 0.2 to about 2 weight percent boron, from about 75 to about 90 weight percent aluminum, and from about 2 to about 24 weight percent glass; and a layer of nickel over said thick film pattern having a thickness of from about 0.05 to about 0.5 mil.

10. A conductor comprising successively a nonconducting substrate; a thick film pattern comprising from about 5 to about 20 weight percent nickel, from about 0.2 to about 4 weight percent silicon, from about 0.2 to about 4 weight percent boron, from about 50 to about 85 weight percent aluminum, and from about 9 to about 40 weight percent glass; and a layer of nickel over said thick film pattern having a thickness of from about 0.05 to about 0.5 mil.

11. A conductor comprising successively a nonconducting substrate; a thick film pattern comprising from about 50 to about 85 weight percent aluminum, from about 9 to about 40 weight percent glass, from about 5 to about 20 weight percent nickel, from about 0 to about 2 weight percent lead oxide, from about 0.2 to about 4 weight percent silicon, and from about 0.2 to about 4 weight percent boron; and a layer of nickel over said thick film pattern having a thickness of from about 0.05 to about 0.5 mil.

* * * * *